US012327761B2

United States Patent
Breil et al.

(10) Patent No.: US 12,327,761 B2
(45) Date of Patent: Jun. 10, 2025

(54) VOID-FREE CONTACT TRENCH FILL IN GATE-ALL-AROUND FET ARCHITECTURE

(71) Applicant: Applied Materials, Inc., Santa Clara, CA (US)

(72) Inventors: Nicolas Louis Breil, San Jose, CA (US); Byeong Chan Lee, San Jose, CA (US); Benjamin Colombeau, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 504 days.

(21) Appl. No.: 17/728,871

(22) Filed: Apr. 25, 2022

(65) Prior Publication Data

US 2022/0384258 A1    Dec. 1, 2022

Related U.S. Application Data

(60) Provisional application No. 63/194,673, filed on May 28, 2021.

(51) Int. Cl.
*H01L 21/285*    (2006.01)
*H01L 21/768*    (2006.01)
(Continued)

(52) U.S. Cl.
CPC .. *H01L 21/76877* (2013.01); *H01L 21/28518* (2013.01); *H01L 21/28556* (2013.01); *H01L 21/28562* (2013.01); *H01L 21/76843* (2013.01); *H01L 21/76897* (2013.01); *H01L 23/5226* (2013.01); *H10D 30/031* (2025.01); *H10D 30/6219* (2025.01); *H10D 30/6729* (2025.01); *H10D 64/01* (2025.01); *H10D 64/251* (2025.01); *H10D 84/013* (2025.01);
(Continued)

(58) Field of Classification Search
None
See application file for complete search history.

(56) References Cited

U.S. PATENT DOCUMENTS 10,192,867 B1 *   1/2019   Frougier   ............ H10D 30/014
2015/0194528 A1   7/2015   Okano
(Continued)

OTHER PUBLICATIONS

International Search Report and Written Opinion dated Aug. 12, 2022 for Application No. PCT/US2022/026141.

*Primary Examiner* — Kretelia Graham
*Assistant Examiner* — William Henry Anderson
(74) *Attorney, Agent, or Firm* — Patterson + Sheridan, LLP

(57) ABSTRACT

A method of forming a contact trench structure in a semiconductor device, the method includes performing a first selective deposition process to form a contact on sidewalls of a trench, each of the sidewalls of the trench comprising a first cross section of a first material and a second cross section of a second material, performing a second selective deposition process to form a metal silicide layer on the contact, performing a first metal fill process to form a contact plug within the trench, the first metal fill process including depositing a contact plug metal material within the trench, performing an etch process to form an opening within the trench, comprising partially etching the contact plug metal material within the trench, and performing a second metal fill process, the second metal fill process comprising depositing the contact plug metal material within the opening.

13 Claims, 10 Drawing Sheets

(51) Int. Cl.
*H01L 23/522* (2006.01)
*H10D 30/01* (2025.01)
*H10D 30/62* (2025.01)
*H10D 30/67* (2025.01)
*H10D 64/01* (2025.01)
*H10D 64/23* (2025.01)
*H10D 84/01* (2025.01)
*H10D 84/03* (2025.01)
*H01L 21/02* (2006.01)
*H01L 21/3213* (2006.01)
*H10D 62/10* (2025.01)

(52) U.S. Cl.
CPC ..... *H10D 84/038* (2025.01); *H01L 21/02647* (2013.01); *H01L 21/32135* (2013.01); *H01L 21/76841* (2013.01); *H01L 21/76879* (2013.01); *H01L 21/76883* (2013.01); *H10D 30/6713* (2025.01); *H10D 30/6735* (2025.01); *H10D 30/6737* (2025.01); *H10D 30/6743* (2025.01); *H10D 30/6757* (2025.01); *H10D 62/115* (2025.01)

(56) References Cited

U.S. PATENT DOCUMENTS

| | | | |
|---|---|---|---|
| 2016/0300731 A1 | 10/2016 | Wu et al. | |
| 2018/0323103 A1* | 11/2018 | Shaviv | H01L 21/67207 |
| 2019/0296128 A1 | 9/2019 | Smith et al. | |
| 2020/0220018 A1* | 7/2020 | Jang | H10D 62/121 |
| 2020/0227318 A1 | 7/2020 | Kawasaki et al. | |
| 2021/0234047 A1* | 7/2021 | Tsai | H10D 62/121 |
| 2021/0305367 A1* | 9/2021 | Ma | H10D 30/6757 |
| 2022/0052203 A1* | 2/2022 | More | H01L 29/0673 |
| 2022/0359653 A1* | 11/2022 | Liu | H10D 30/6713 |

* cited by examiner

VOID-FREE CONTACT TRENCH FILL IN GATE-ALL-AROUND FET ARCHITECTURE

CROSS-REFERENCE TO RELATED APPLICATIONS

This application claims benefit of U.S. provisional patent application Ser. No. 63/194,673, filed May 28, 2021, which is herein incorporated by reference.

BACKGROUND

Field

Embodiments described herein generally relate to semiconductor device fabrication, and more particularly, to systems and methods of forming a contact trench structure in a gate-all-around field-effect transistor (FET).

Description of the Related Art

Multi-gate metal-oxide-semiconductor field-effect transistors (MOSFETs), such as double-gate field-effect transistors (FinFETs), silicon-on-insulator (SOI) tri-gate MOSFETs, and gate all around (GAA) FETs, that incorporate more than one gate into a single device and are thus more scalable than the conventional planar bulk MOSFET, pose challenges in manufacturability due to their three-dimensional (3D) designs and small sizes. In architectures for sub 10-15 nm technology nodes, such as GAA FETs, in which a gate is placed on two or all four sides of a silicon-based channel, parasitic or external resistance significantly impacts device performance. To minimize such parasitic resistance, contacts are formed to interface between a silicon-based channel and a metal contact plug. However, this structure poses further challenges in forming metal contact plugs, as the existing metal fill processes often result in formation of contact plugs having voids or cores formed therein. The presence of voids in contact plugs can drastically increase contact resistance.

Thus, there is a need for systems and methods that can fabricate FET devices with minimized parasitic resistance and void-free metal contact plugs.

SUMMARY

Embodiments of the present disclosure provide a method of forming a contact trench structure in a semiconductor device. The method includes performing a first selective deposition process to form a contact on sidewalls of a trench, each of the sidewalls of the trench comprising a first cross section of a first material and a second cross section of a second material, performing a second selective deposition process to form a metal silicide layer on the contact, performing a first metal fill process to form a contact plug within the trench, the first metal fill process including depositing a contact plug metal material within the trench, performing an etch process to form an opening within the trench, comprising partially etching the contact plug metal material within the trench, and performing a second metal fill process, the second metal fill process comprising depositing the contact plug metal material within the opening. The first selective deposition process includes growing silicide material on the sidewalls of the trench, and etching portions of the silicide material formed on the first cross section of the first material to form the contact selectively on the second cross section of the second material within the trench. The second selective deposition process includes growing metal silicide material on the contact and the first cross section of the first material within the trench, and etching portions of the metal silicide material formed on the first cross section of the first material to form the metal silicide layer selectively on the contact.

Embodiments of the present disclosure also provide a method of forming a void-free trench contact plug in a semiconductor device. The method includes performing a first metal fill process to form a contact plug within a trench, the first metal fill process comprising depositing a contact plug metal material within the trench, where sidewalls of the trench comprise a first cross section of a first material, on which an epitaxially grown contact is formed, and a second cross section of a second material, performing an etch process to form an opening within the trench, comprising partially etching the contact plug metal material within the trench, and performing a second metal fill process, the second metal fill process comprising depositing the contact plug metal material within the opening.

Embodiments of the present disclosure further provide a semiconductor structure. The semiconductor structure includes a stack of first semiconductor layers and second semiconductor layers, where a trench is formed through the stack, a spacer formed at an end of each of the first semiconductor layers facing the trench, a contact epitaxially grown on each of first cross sections of the second semiconductor layers within the trench, a metal silicide layer grown over the contact, a barrier metal layer over the metal silicide layer within the trench, and a void-free metal contact plug within the trench.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The embodiments described herein provide systems and methods for forming transistor devices for extremely scaled process nodes, such as gate-all-around (GAA) FETs with a metal contact plug formed within a trench between adjacent device modules, and contacts that interface between the contact plug and silicon-based channels in the device modules. The contacts are formed by a selective deposition process, reducing parasitic resistance. The trench is subsequently filled with metal over the contacts to form a metal contact plug, but the metal contact plug may form voids or cores therein. Thus, the contact plug formed in the trench is partially etched to form an opening within the trench, and the opening is filled with the metal to form a void-free contact plug, reducing contact resistance.

Figure 1:
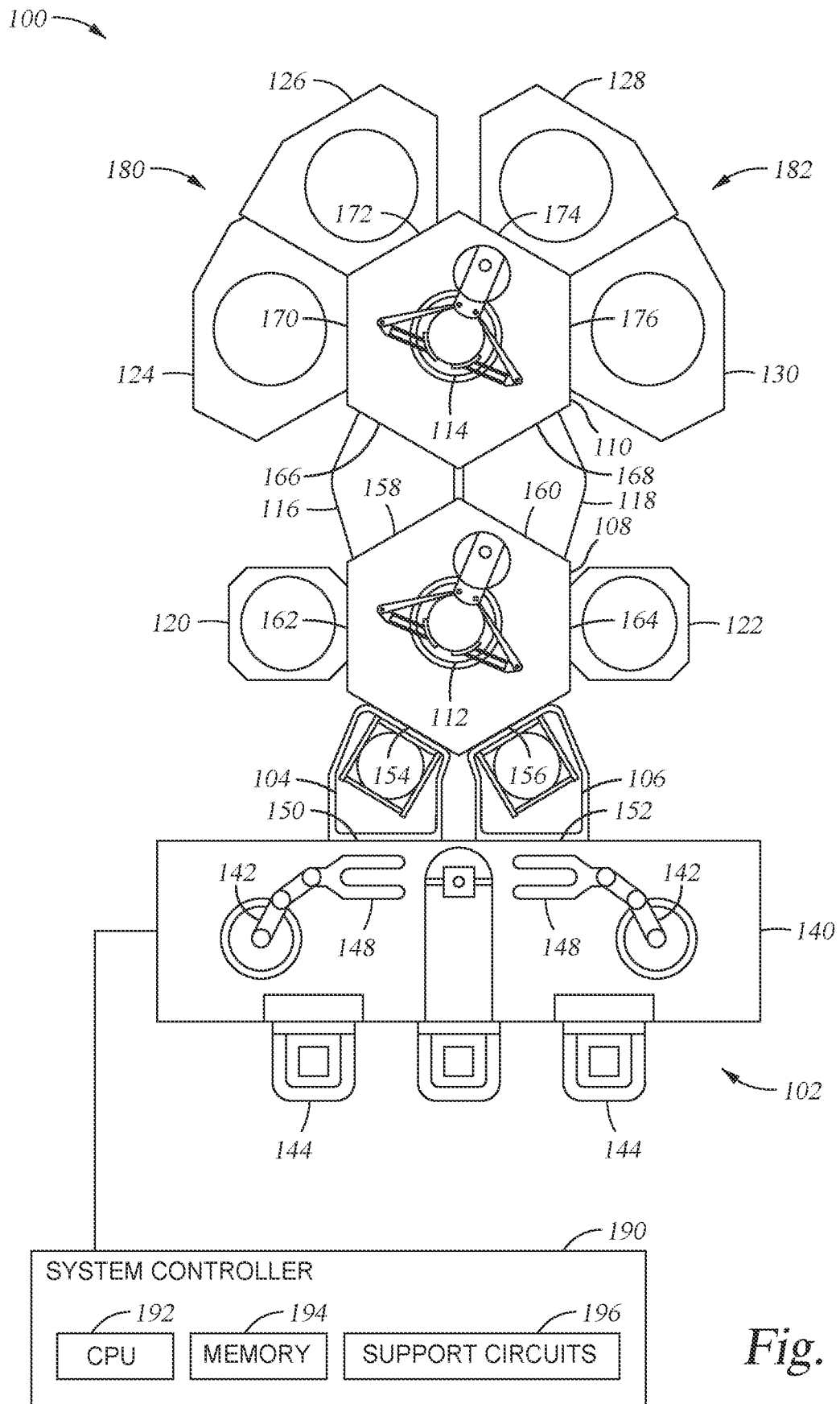
FIG. 1 is a schematic top-view diagram of an example multi-chamber processing system according to one embodiment.

FIG. 1 is a schematic top-view diagram of an example of a multi-chamber processing system 100 according to some examples of the present disclosure. The processing system 100 generally includes a factory interface 102, load lock chambers 104, 106, transfer chambers 108, 110 with respective transfer robots 112, 114, holding chambers 116, 118, and processing chambers 120, 122, 124, 126, 128, 130. As detailed herein, wafers in the processing system 100 can be processed in and transferred between the various chambers without exposing the wafers to an ambient environment exterior to the processing system 100 (e.g., an atmospheric ambient environment such as may be present in a fab). For example, the wafers can be processed in and transferred between the various chambers in a low pressure (e.g., less than or equal to about 300 Torr) or vacuum environment without breaking the low pressure or vacuum environment between various processes performed on the wafers in the processing system 100. Accordingly, the processing system 100 may provide for an integrated solution for some processing of wafers.

Examples of a processing system that may be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 140 and factory interface robots 142 to facilitate transfer of wafers. The docking station 140 is configured to accept one or more front opening unified pods (FOUPs) 144. In some examples, each factory interface robot 142 generally comprises a blade 148 disposed on one end of the respective factory interface robot 142 configured to transfer the wafers from the factory interface 102 to the load lock chambers 104, 106.

The load lock chambers 104, 106 have respective ports 150, 152 coupled to the factory interface 102 and respective ports 154, 156 coupled to the transfer chamber 108. The transfer chamber 108 further has respective ports 158, 160 coupled to the holding chambers 116, 118 and respective ports 162, 164 coupled to processing chambers 120, 122. Similarly, the transfer chamber 110 has respective ports 166, 168 coupled to the holding chambers 116, 118 and respective ports 170, 172, 174, 176 coupled to processing chambers 124, 126, 128, 130. The ports 154, 156, 158, 160, 162, 164, 166, 168, 170, 172, 174, 176 can be, for example, slit valve openings with slit valves for passing wafers therethrough by the transfer robots 112, 114 and for providing a seal between respective chambers to prevent a gas from passing between the respective chambers. Generally, any port is open for transferring a wafer therethrough. Otherwise, the port is closed.

The load lock chambers 104, 106, transfer chambers 108, 110, holding chambers 116, 118, and processing chambers 120, 122, 124, 126, 128, 130 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 142 transfers a wafer from a FOUP 144 through a port 150 or 152 to a load lock chamber 104 or 106. The gas and pressure control system then pumps down the load lock chamber 104 or 106. The gas and pressure control system further maintains the transfer chambers 108, 110 and holding chambers 116, 118 with an interior low pressure or vacuum environment (which may include an inert gas). Hence, the pumping down of the load lock chamber 104 or 106 facilitates passing the wafer between, for example, the atmospheric environment of the factory interface 102 and the low pressure or vacuum environment of the transfer chamber 108.

With the wafer in the load lock chamber 104 or 106 that has been pumped down, the transfer robot 112 transfers the wafer from the load lock chamber 104 or 106 into the transfer chamber 108 through the port 154 or 156. The transfer robot 112 is then capable of transferring the wafer to and/or between any of the processing chambers 120, 122 through the respective ports 162, 164 for processing and the holding chambers 116, 118 through the respective ports 158, 160 for holding to await further transfer. Similarly, the transfer robot 114 is capable of accessing the wafer in the holding chamber 116 or 118 through the port 166 or 168 and is capable of transferring the wafer to and/or between any of the processing chambers 124, 126, 128, 130 through the respective ports 170, 172, 174, 176 for processing and the holding chambers 116, 118 through the respective ports 166, 168 for holding to await further transfer. The transfer and holding of the wafer within and among the various chambers can be in the low pressure or vacuum environment provided by the gas and pressure control system.

The processing chambers 120, 122, 124, 126, 128, 130 can be any appropriate chamber for processing a wafer. In some examples, the processing chamber 122 can be capable of performing a cleaning process, the processing chamber 120 can be capable of performing an etch process, and the processing chambers 124, 126, 128, 130 can be capable of performing respective epitaxial growth processes. The processing chamber 122 may be a SiCoNi™ Preclean chamber available from Applied Materials of Santa Clara, Calif. The processing chamber 120 may be a Selectra™ Etch chamber available from Applied Materials of Santa Clara, Calif.

A system controller 190 is coupled to the processing system 100 for controlling the processing system 100 or components thereof. For example, the system controller 190 may control the operation of the processing system 100 using a direct control of the chambers 104, 106, 108, 116, 118, 110, 120, 122, 124, 126, 128, 130 of the processing system 100 or by controlling controllers associated with the chambers 104, 106, 108, 116, 118, 110, 120, 122, 124, 126, 128, 130. In operation, the system controller 190 enables data collection and feedback from the respective chambers to coordinate performance of the processing system 100.

The system controller 190 generally includes a central processing unit (CPU) 192, memory 194, and support circuits 196. The CPU 192 may be one of any form of a general purpose processor that can be used in an industrial setting. The memory 194, or non-transitory computer-readable medium, is accessible by the CPU 192 and may be one or more of memory such as random access memory (RAM), read only memory (ROM), floppy disk, hard disk, or any other form of digital storage, local or remote. The support circuits 196 are coupled to the CPU 192 and may comprise cache, clock circuits, input/output subsystems, power supplies, and the like. The various methods disclosed herein may generally be implemented under the control of the CPU 192 by the CPU 192 executing computer instruction code stored in the memory 194 (or in memory of a particular process chamber) as, for example, a software routine. When the computer instruction code is executed by the CPU 192, the CPU 192 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 108, 110 and the holding chambers 116, 118. In other examples, more or fewer transfer chambers (e.g., one transfer chamber) and/or more or fewer holding chambers (e.g., no holding chambers) may be implemented as a transfer apparatus in a processing system.

Figure 2:
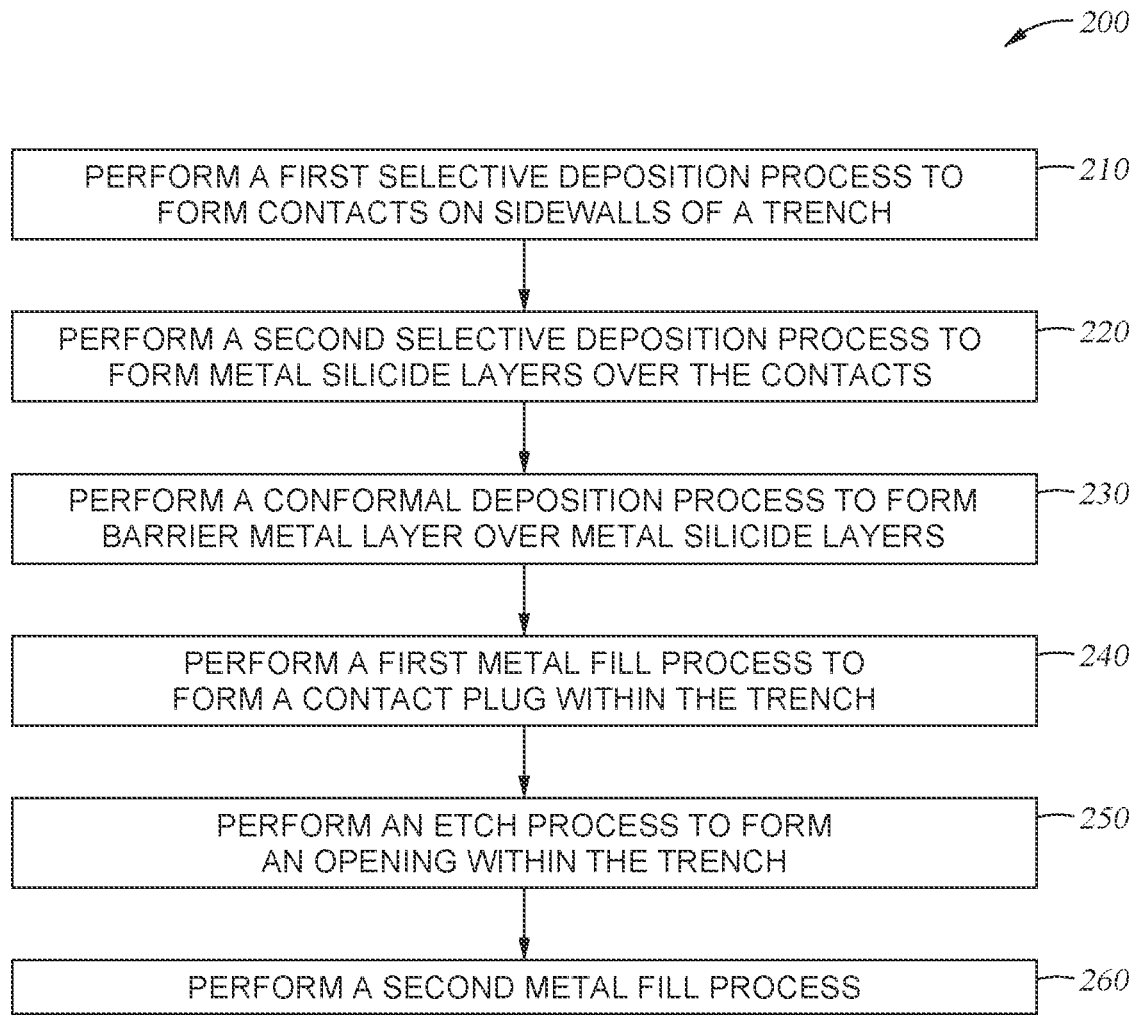
FIG. 2 depicts a process flow diagram of a method of forming a contact trench structure in a semiconductor structure according to one embodiment.
Figure 3A:
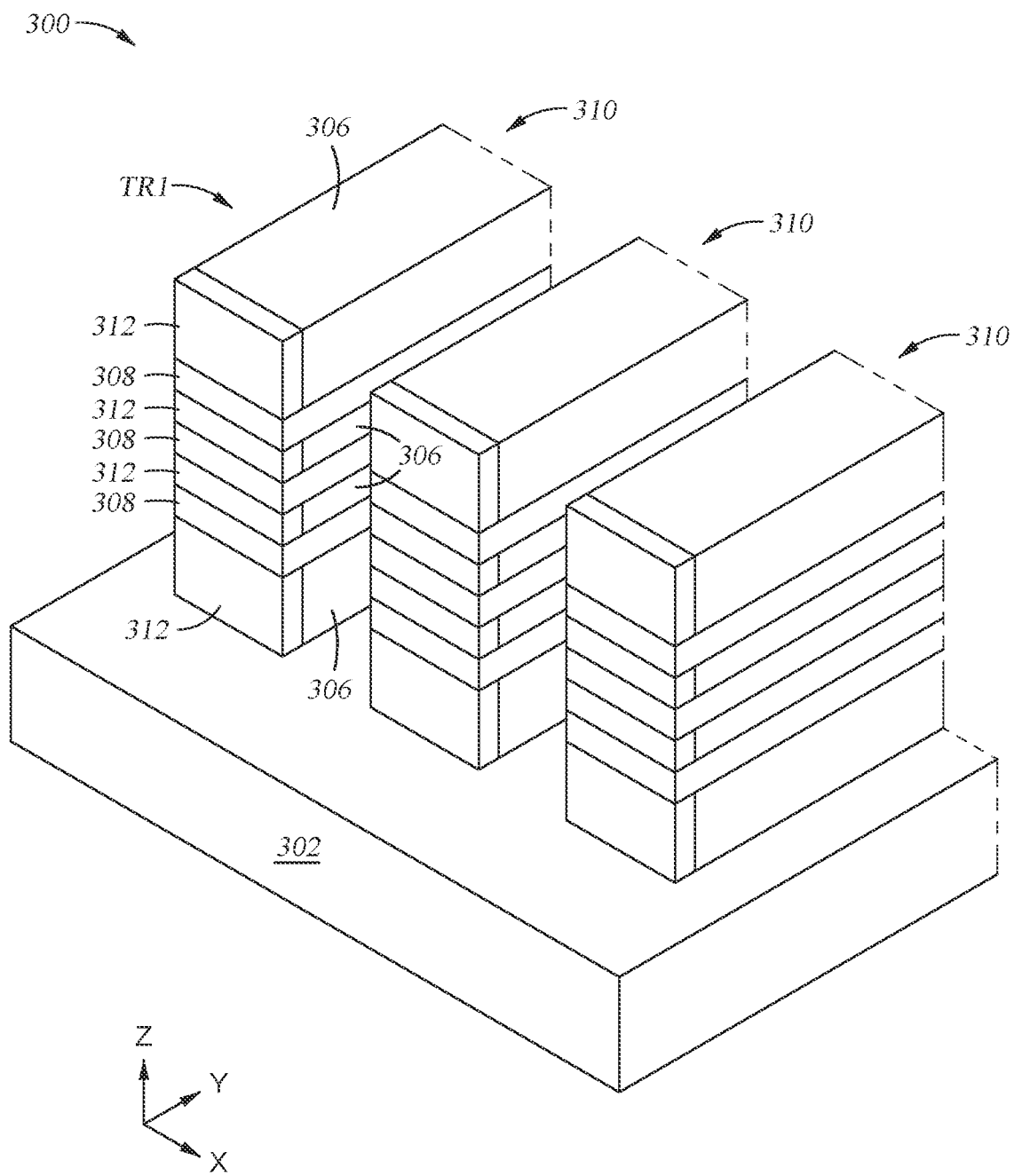
FIG. 3A is an isometric view of a semiconductor structure according to one embodiment.

FIG. 2 depicts a process flow diagram of a method 200 of forming a contact trench structure in a semiconductor structure 300 according to one or more implementations of the present disclosure. FIG. 3A is an isometric view of the semiconductor structure 300. FIGS. 3B, 3C, 3D, 3E, 3F, 3G, and 3H are cross-sectional views of a portion of the semiconductor structure 300 corresponding to various states of the method 200. It should be understood that FIGS. 3A, 3B, 3C, 3D, 3E, 3F, 3G, and 3H illustrate only partial schematic views of the semiconductor structure 300, and the semiconductor structure 300 may contain any number of transistor sections and additional materials having aspects as illustrated in the figures. It should also be noted that although the method illustrated in FIG. 2 is described sequentially, other process sequences that include one or more operations that have been omitted and/or added, and/or has been rearranged in another desirable order, fall within the scope of the embodiments of the disclosure provided herein.

Referring to FIGS. 3A, 3B, 3C, 3D, 3E, 3F, 3G, and 3H, the semiconductor structure 300 may include a substrate 302 having a first gate-all-around field effect transistor (GAA FET) module TR1 and a second GAA FET module TR2. The second GAA FET module TR2 is not shown in FIG. 3A. The first GAA FET module TR1 and the second GAA FET module TR2 are separated by a trench 304.

The term "substrate" as used herein refers to a layer of material that serves as a basis for subsequent processing operations and includes a surface to be cleaned. The substrate 302 may be a silicon based material or any suitable insulating materials or conductive materials as needed. The substrate 302 may include a material such as crystalline silicon (e.g., Si<100> or Si<111>), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, or sapphire.

Each of the GAA FET modules TR1 and TR2 includes first semiconductor layers 306 and second semiconductor layers 308 that are alternately and repeatedly stacked on the substrate 302. The first semiconductor layer 306 is formed of a first material having etch selectivity to a second material of which the second semiconductor layer 308 is formed (i.e., an etch rate of the first material is higher than an etch rate of the second material). The etch selectivity (i.e., a ratio of the etch rate of the first material to the etch rate of the second material) is between about 10:1 to 200:1. Example combinations of the first material and the second material include silicon germanium (SiGe)/silicon (Si), silicon germanium (SiGe)/germanium (Ge), and germanium tin (GeSn)/silicon (Si). The stack of the first semiconductor layers 306 and the second semiconductor layers 308 is separated by the trench 304 between the first and second GAA FET modules TR1, TR2, and divided into separate pillars 310 within each module of the first and second GAA FET modules TR1, TR2. The first semiconductor layers 306 may be selectively etched to form indentations at an end of the first semiconductor layers 306 facing the trench 304, in each of which a spacer 312 is formed. These spacers 312 may be formed between source/drain regions (not shown) that are to be deposited next to the pillars in the first and second GAA FET modules TR1, TR2. The spacers 312 may be formed of dielectric material, such as silicon dioxide ($SiO_2$) silicon nitride ($Si_3N_4$), silicon oxynitride (SiON), silicon oxycarbide (SiOCN), boron-doped silicon oxycarbonitride (SiOCBN), aluminum oxide ($Al_2O_3$), or hafnium oxide ($HfO_2$).

The second semiconductor layers 308 in the pillars may serve as channels having a width of between several nanometers and several tens of tens nanometers.

The first and second semiconductor layers 306 and 308 may be formed using any suitable deposition technique, such as chemical vapor deposition (CVD), atomic layer deposition (ALD), or physical vapor deposition (PVD), and the pillars 310 are formed by patterning technique, such as a lithography and etch process. The first and second semiconductor layers 306 and 308 may each have thickness of between about 6 nm and about 14 nm, for example, about 10 nm. The selective etching of the first semiconductor layers 306 may be performed by any appropriate etch process, such as a dry plasma etch process.

Figure 3B:
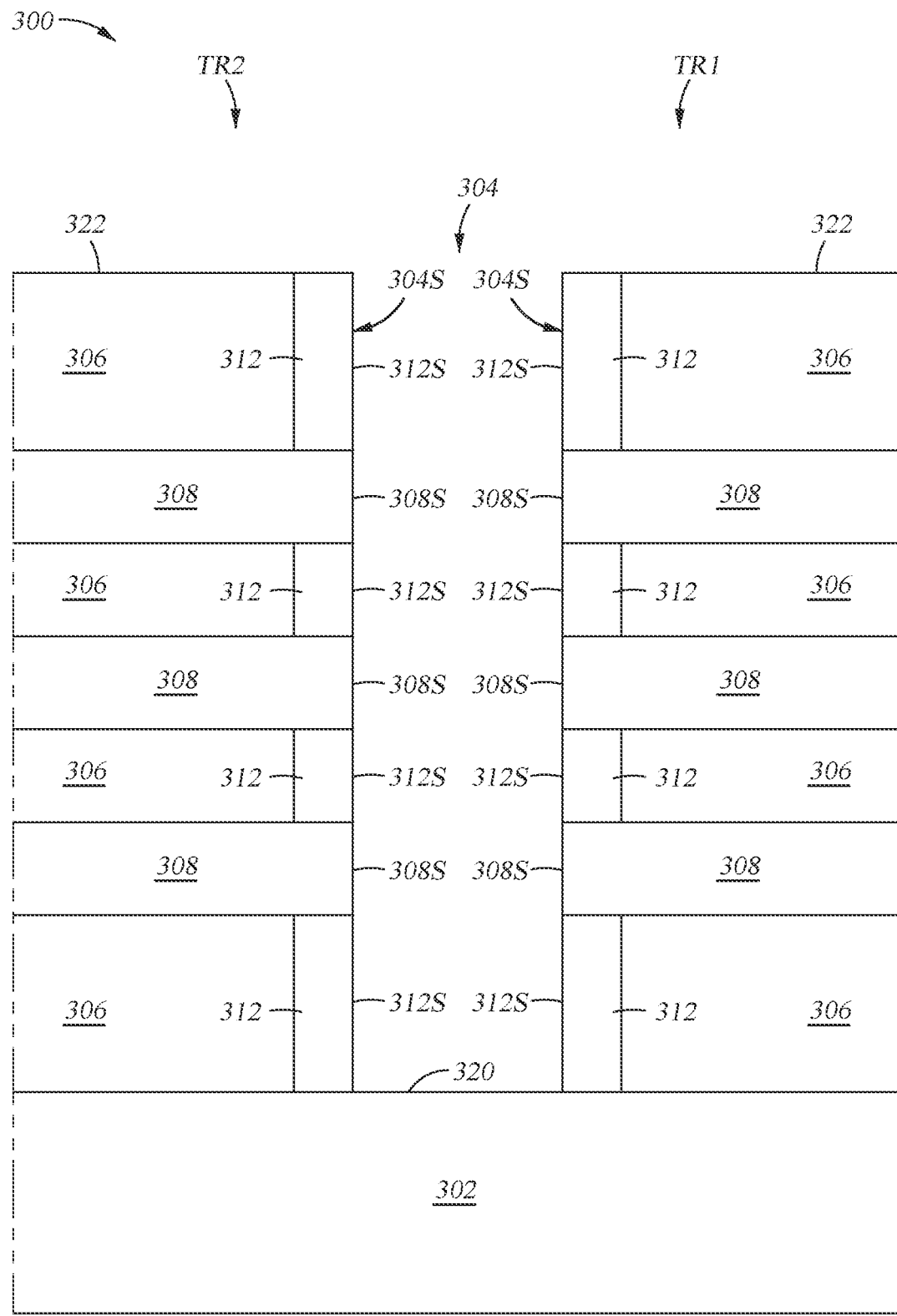
FIGS. 3B, 3C, 3D, 3E, 3F, 3G, and 3H are cross-sectional views of a portion of a semiconductor structure according to one embodiment.
Figure 3C:
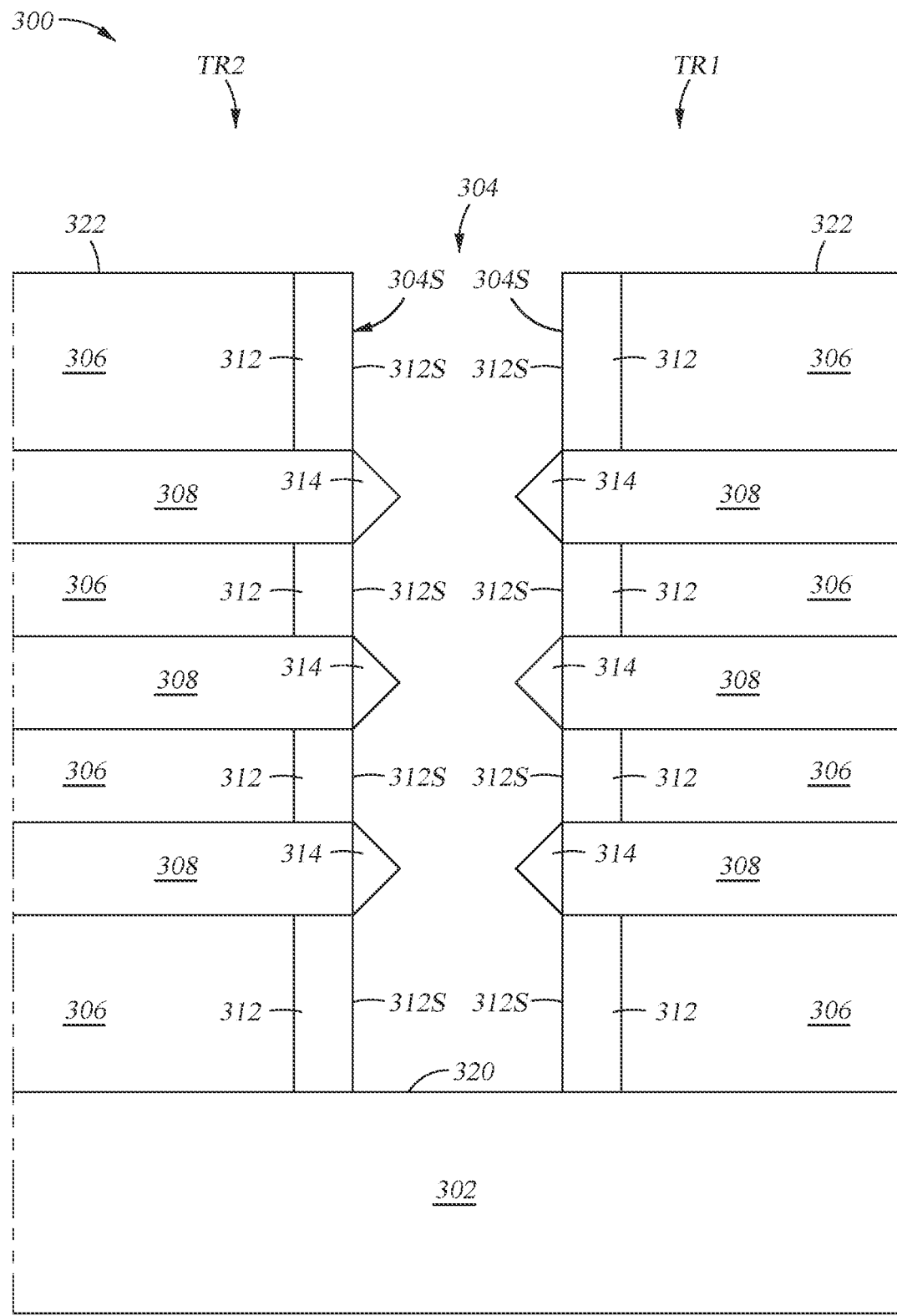

The method 200 begins with a first selective deposition process in block 210, to form contacts 314 selectively on exposed cross sections 308S of the second semiconductor layers 308 within the trench 304, as shown in FIG. 3C. The contacts 314 are formed as interfaces between the second semiconductor layers 308 and metal contact plugs, as discussed below, to minimize parasitic resistance. The contacts 314 are formed of a third material. Examples of the third material includes silicon (Si), silicon carbide (SiC), and silicon germanium (SiGe) with a ratio of germanium (Ge) ranging between 20% and 100%. The contact 314 may be doped with p-type dopants such as boron (B) or gallium (Ga), with the concentration of between about $10^{20}$ $cm^{-3}$ and $5·10^{21}$ $cm^{-3}$, depending upon the desired conductive characteristic of the contacts 314. The contact 314 may be doped with n-type dopants such as phosphorus (P), antimony (Sb), with the concentration between about $10^{20}$ $cm^{-3}$ and $5·10^{21}$ $cm^{-3}$.

The first selective deposition process includes a first deposition process and a first etch process. The first deposition process is an epitaxial deposition process. The selectivity in the first selective deposition process may arise from differences in nucleation of the third material on the exposed cross sections 308S of the second semiconductor layers 308 (e.g., silicon (Si) or silicon germanium (SiGe)) and on exposed cross sections 312S of the spacer 312 (e.g., silicon dioxide ($SiO_2$) or silicon nitride ($Si_3N_4$)) within the trench 304. The nucleation may occur at a faster rate on the exposed cross sections 308S of the second semiconductor layer 308 (e.g., silicon (Si) or silicon germanium (SiGe)) than on the exposed cross sections 312S of the spacer 312 (e.g., silicon dioxide ($SiO_2$) or silicon nitride ($Si_3N_4$)) (as shown in FIG. 3B), and thus an epitaxial layer of the third material may be formed on the exposed cross sections 308S of the second semiconductor layers 308 (e.g., silicon (Si) or silicon germanium (SiGe)), while an amorphous layer of the third material may be formed on the exposed cross sections 312S of the spacer 312 (e.g., silicon dioxide ($SiO_2$) or silicon nitride ($Si_3N_4$)) within the trench 304, when sidewalls 304S of the trench 304 is exposed to a deposition gas containing a silicon source and a metal source in the first deposition process. In the subsequent first etch process, the amorphous layers of the third material formed on the exposed cross sections 312S of the spacer 312 can be etched at a faster rate than the epitaxial layers of the third material formed on the exposed cross sections 308S of the second semiconductor layers 308, by an appropriate etching gas. Thus, an overall result of the first deposition process and the first etch process combined can be epitaxial growth of the third material on the exposed cross sections 308S of the second semiconductor layers 308 within the trench 304, while minimizing growth, if any, of the third material I on the exposed cross sections 312S of the spacer 312.

In some embodiments, the silicon source in the deposition gas may include, for example, a silicon-containing precursor such as silane ($SiH_4$), dichlorosilane ($SiH_2Cl_2$), trichlorosilane ($SiHCl_3$), tetrachlorosilane ($SiCl_4$), disilane ($Si_2H_6$) and trisilane ($Si_3H_8$), or a combination thereof. The deposition gas may alternatively include a germanium source including a germanium containing precursor such as germane ($GeH_4$) and digermane ($Ge_2H_6$). The process gas may further include a dopant source. The dopant source may include, for example, carbon, phosphorous, boron, arsenic, gallium, or aluminum, depending upon the desired conductive characteristic of the epitaxially deposited contacts 314. The metal source in the deposition gas may include, for example, nickel (Ni), cobalt (Co), tungsten (W), titanium (Ti), and iron (Fe). The dopant source may include a precursor diborane ($B_2H_6$) for p-type doping and phosphine ($PH_3$) for n-type doping. The etching gas includes an etchant gas and a carrier gas. The etchant gas may include halogen-containing gas, such as hydrogen chloride (HCl), chlorine ($Cl_2$), or hydrogen fluoride (HF). The carrier gas may include nitrogen ($N_2$), argon (Ar), helium (He), or hydrogen ($H_2$).

The first deposition process and the first etch process in block 210 may be each performed in a processing chamber, such as the processing chamber 120, 122, 124, 126, 128, or 130 shown in FIG. 1, at a temperature of between about 300° C. and about 800° C. and at a pressure of between 5° Torr and 600° Torr.

A cycle of the first deposition and first etch processes may be repeated as needed to obtain a desired thickness of the contacts 314 within the trench 304. A thickness of the contacts 314 may be about 5 Å and about 10 Å.

It should be noted that epitaxially grown third material may exhibit definite crystal orientation relationship with respect to the exposed cross sections 308S of the second semiconductor layers 308, as the epitaxially grown third material have similar crystal structures and small lattice mismatch to the exposed cross sections 308S of the second semiconductor layers 308. For example, nickel silicide ($NiSi_2$) can be epitaxially grown on (100) and (111) silicon single crystals, with good lattice match. Due to this crystal orientation relationship of the epitaxially grown third material to the exposed cross sections 308S of the second semiconductor layers 308, the epitaxially grown contacts 314 each may have a ball shape or a pyramid shape, depending on the conditions for the first deposition and first etch processes.

Figure 3D:
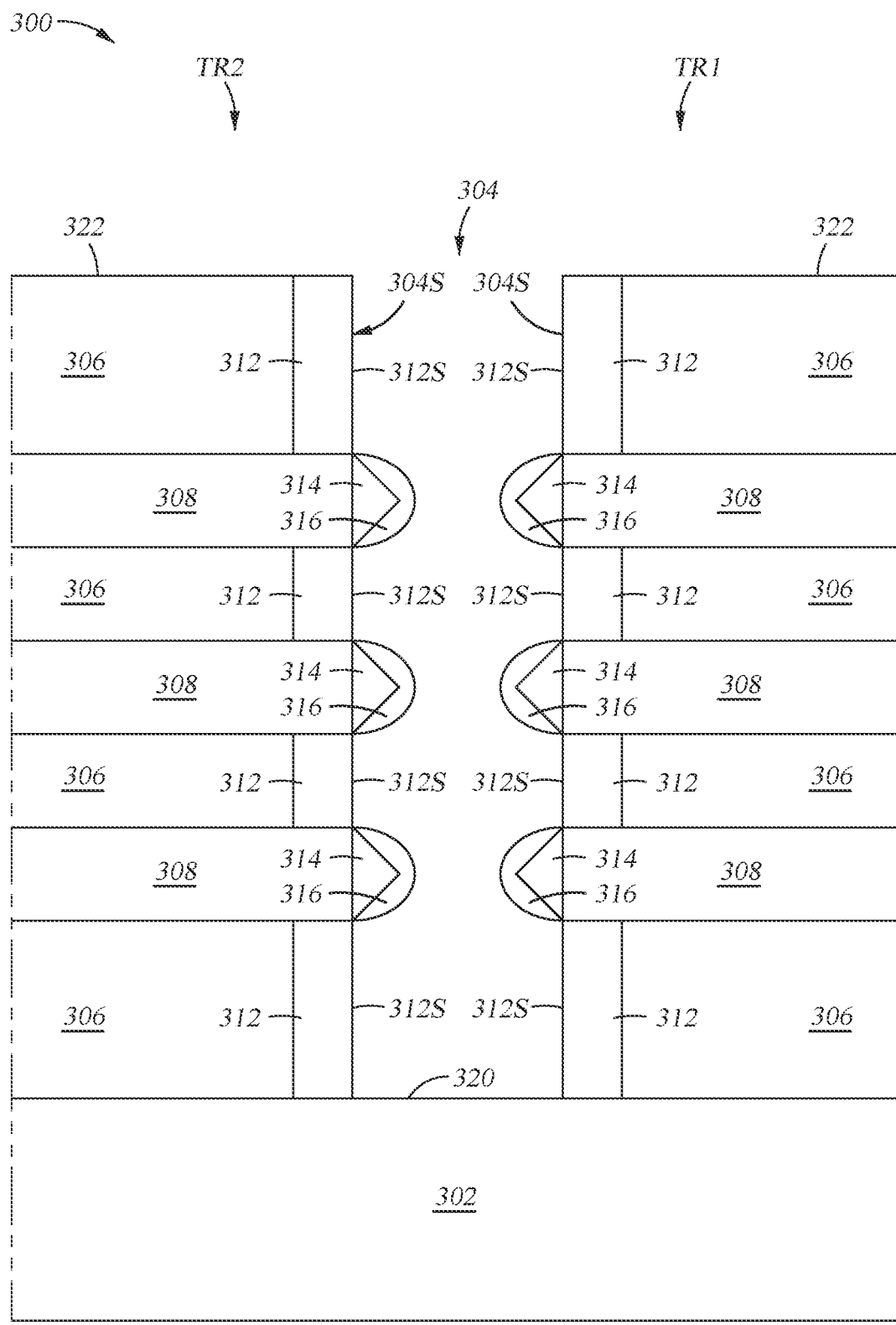

In block 220, a second selective deposition process is performed to deposit metal silicide layers 316 over the contacts 314, as shown in FIG. 3D. The metal silicide layers 316 pad the contacts 314 and provide an electrical connection between the contact plugs in the trench 304 and the second semiconductor layers 308, while maintaining an electrical connection therethrough. The metal silicide layer 316 may be formed of a metal silicide material, such as titanium (Ti) silicide, cobalt (Co) silicide, nickel (Ni) silicide, molybdenum (Mo) silicide, or tantalum (Ta) silicide.

The second selective deposition process includes a second deposition process and a second etch process. The selectivity in the second selective deposition process may arise from differences in nucleation of the metal silicide material on the contacts 314 (e.g., silicon (Si) or silicon germanium (SiGe)) and on the exposed cross sections 312S of the spacer 312 (e.g., silicon dioxide ($SiO_2$) or silicon nitride ($Si_3N_4$)) within the trench 304. The nucleation may occur at a faster rate on the contacts 314 (e.g., silicon (Si) or silicon germanium (SiGe)) than on the exposed cross sections 312S of the spacer 312 (e.g., silicon dioxide ($SiO_2$) or silicon nitride ($Si_3N_4$)), and thus an epitaxial layer of the metal silicide material may be formed on the contacts 314 (e.g., silicon (Si) or silicon germanium (SiGe)), while an amorphous layer of the metal silicide material may be formed on the exposed cross sections 312S of the spacer 312 (e.g., silicon dioxide ($SiO_2$) or silicon nitride ($Si_3N_4$)) within the trench 304, when exposed to a deposition gas containing a metal silicide source in the second deposition process. In the subsequent second etch process, the amorphous layers of the metal silicide material formed on the exposed cross sections 312S of the spacer 312 can be etched at a faster rate than the epitaxial layers of metal silicide material formed on the contacts 314, by an appropriate etching gas. Thus, an overall result of the second deposition process and the second etch process combined can be epitaxial growth of the metal silicide material on the contacts 314 within the trench 304, while minimizing growth, if any, of the metal silicide material on the exposed cross sections 312S of the spacer 312.

In some embodiments, the metal silicide source may include titanium (Ti), tantalum (Ta), or combination thereof. The etching gas includes an etchant gas and a carrier gas. The etchant gas may include a chlorine containing gas, such as hydrogen chloride (HCl), chlorine ($Cl_2$), carbon tetrachloride ($CCl_4$), chloroform ($CHCl_3$), dichloromethane ($CH_2Cl_2$), or chloromethane ($CH_3Cl$). The carrier gas may include nitrogen ($N_2$), argon (Ar), helium (He), or hydrogen ($H_2$). A carbon containing gas, such as methane ($CH_4$), ethane ($C_2H_6$), or ethylene ($C_2H_4$), may be also supplied as a catalyst for the etching of the metal silicide layers 316.

The second deposition process and the second etch process in block 220 may be each performed in a processing chamber, such as the processing chamber 120, 122, 124, 126, 128, or 130 shown in FIG. 1, at a temperature of between about 300° C. and about 800° C. and at a pressure of between 1° Torr and 50° Torr.

A cycle of the second deposition and second etch processes may be repeated as needed to obtain a desired thickness of the metal silicide layer 316.

Figure 3E:
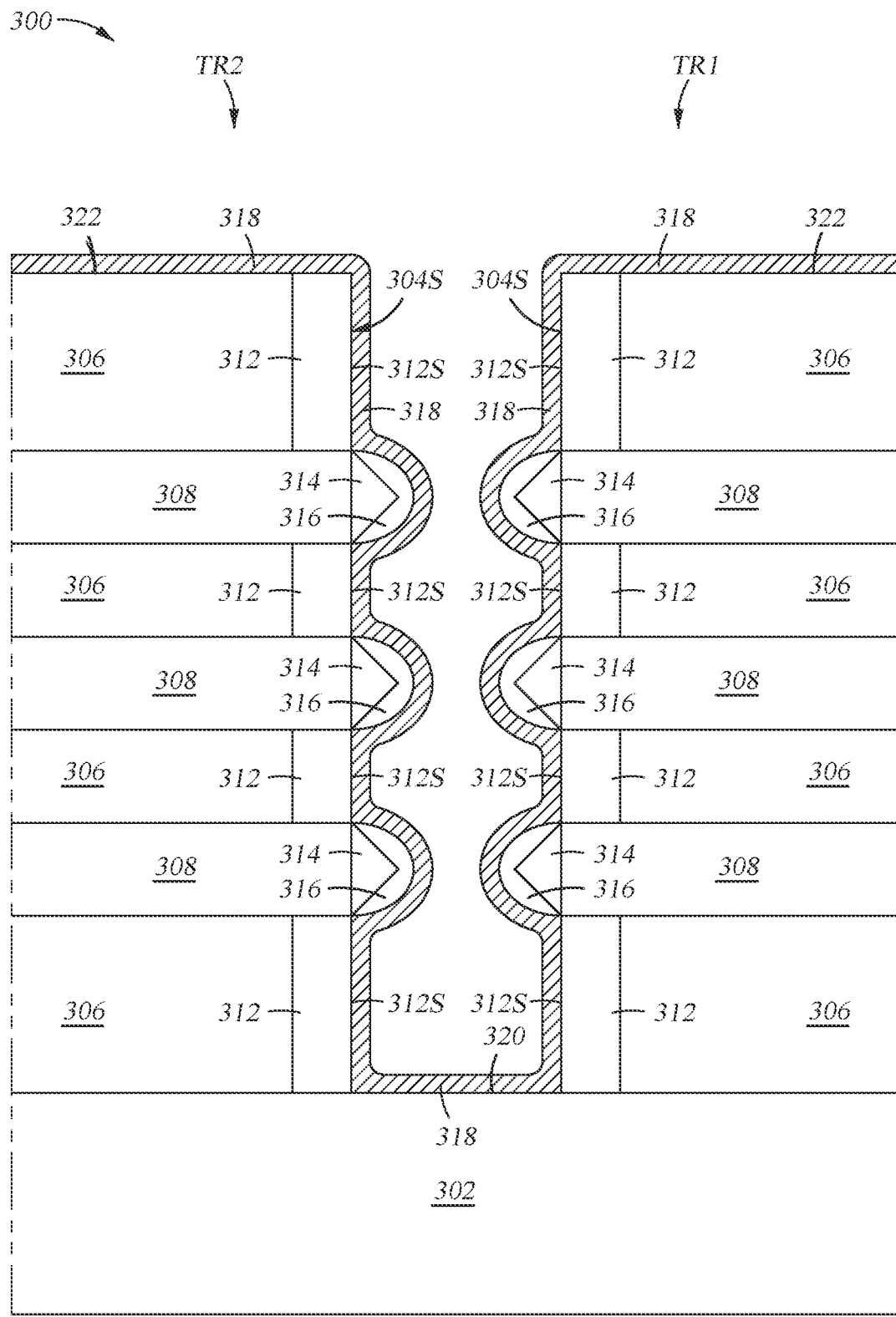

In block 230, a conformal deposition process is performed to form barrier metal layers 318 over exposed surfaces of the trench 304, including the metal silicide layers 316, the exposed cross sections 312S of the spacers 312, a bottom surface 320 of the trench 304, and top surfaces 322 of the first and second GAA FET modules TR1, TR2, as shown in FIG. 3E. The barrier metal layers 318 protects the metal silicide layer 316 and allow nucleation and growth of the contact plugs 324 in the trench 304, as discussed below. The barrier metal layers 318 may be formed of a barrier metal material that is titanium nitride (TiN), or tantalum nitride (TaN).

The conformal deposition process in block 230 may include any appropriate deposition process, such as atomic layer deposition (ALD), chemical vapor deposition (CVD), spin-on, physical vapor deposition (PVD), or the like, in a processing chamber, such as the processing chamber 120, 122, 124, 126, 128, or 130 shown in FIG. 1, at a temperature of between about 100° C. and about 300° C.

Figure 3F:
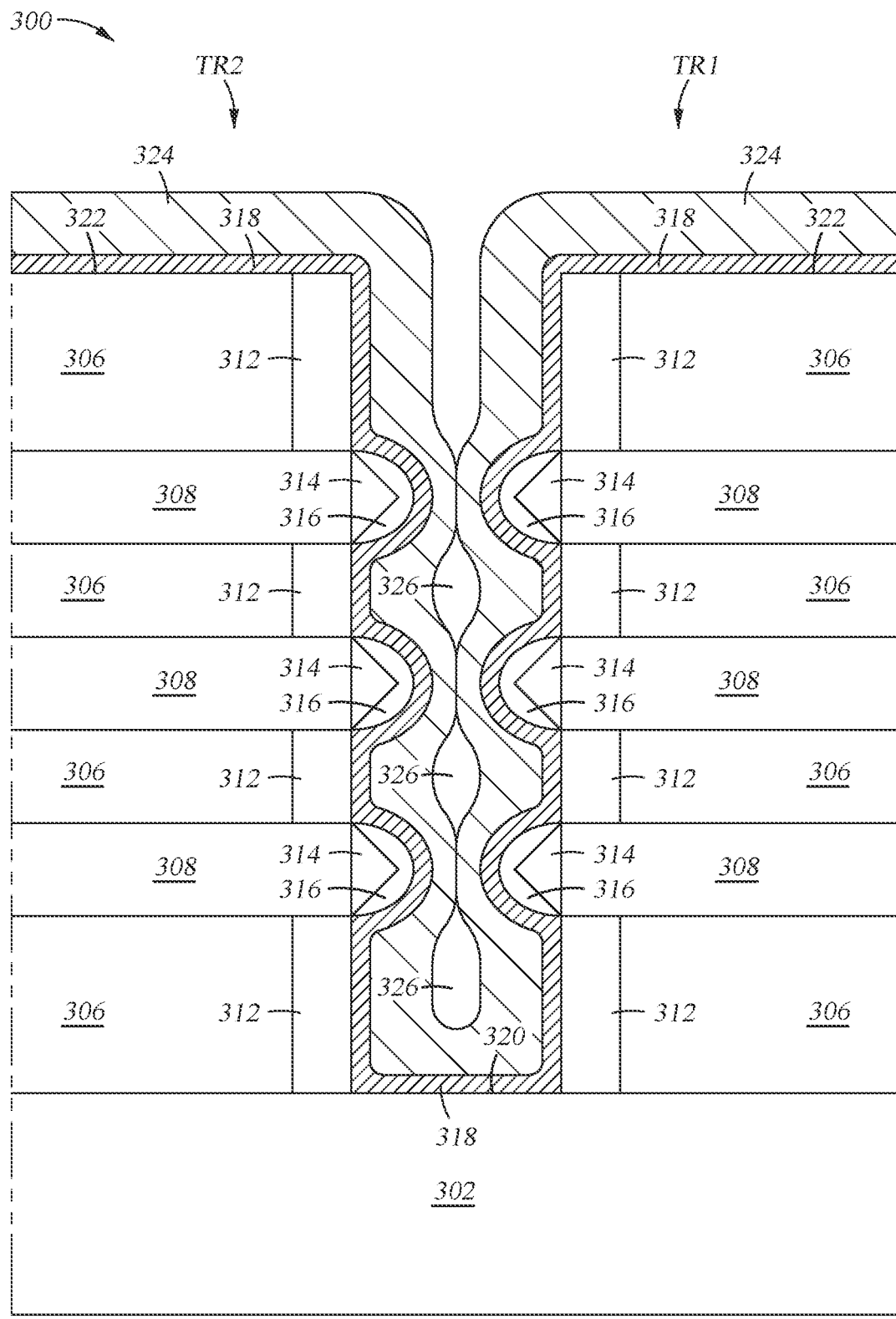

In block 240, a first metal fill process is performed to fill the trench 304 with metal to form a contact plug 324, as shown in FIG. 3F. The contact plug 324 formed in the first metal fill process in block 240 may be formed of contact plug metal material, such as tungsten (W), cobalt (Co), ruthenium (Ru), or molybdenum (Mo). The contact plug 324 may be p-type doped or n-type doped. The first metal fill process in block 240 may include a chemical vapor deposition (CVD) process using a tungsten-containing precursor, such as $WF_6$, or a cobalt-containing precursor, in a processing chamber, such as the processing chamber 120, 122, 124, 126, 128, or 130 shown in FIG. 1.

The contact plug 324 deposited in the first metal fill process in block 240 may include voids 326 in the trench 304 because a width of the trench 304 is narrowed by the contacts 314, the metal silicide layer 316, and the barrier metal layer 318 formed in blocks 210-230, and thus paths for metal fill deposition are partially blocked. The method 200 proceeds to the blocks 240-250 to remove the voids 326 in the contact plug 324 within the trench 304.

Figure 3G:
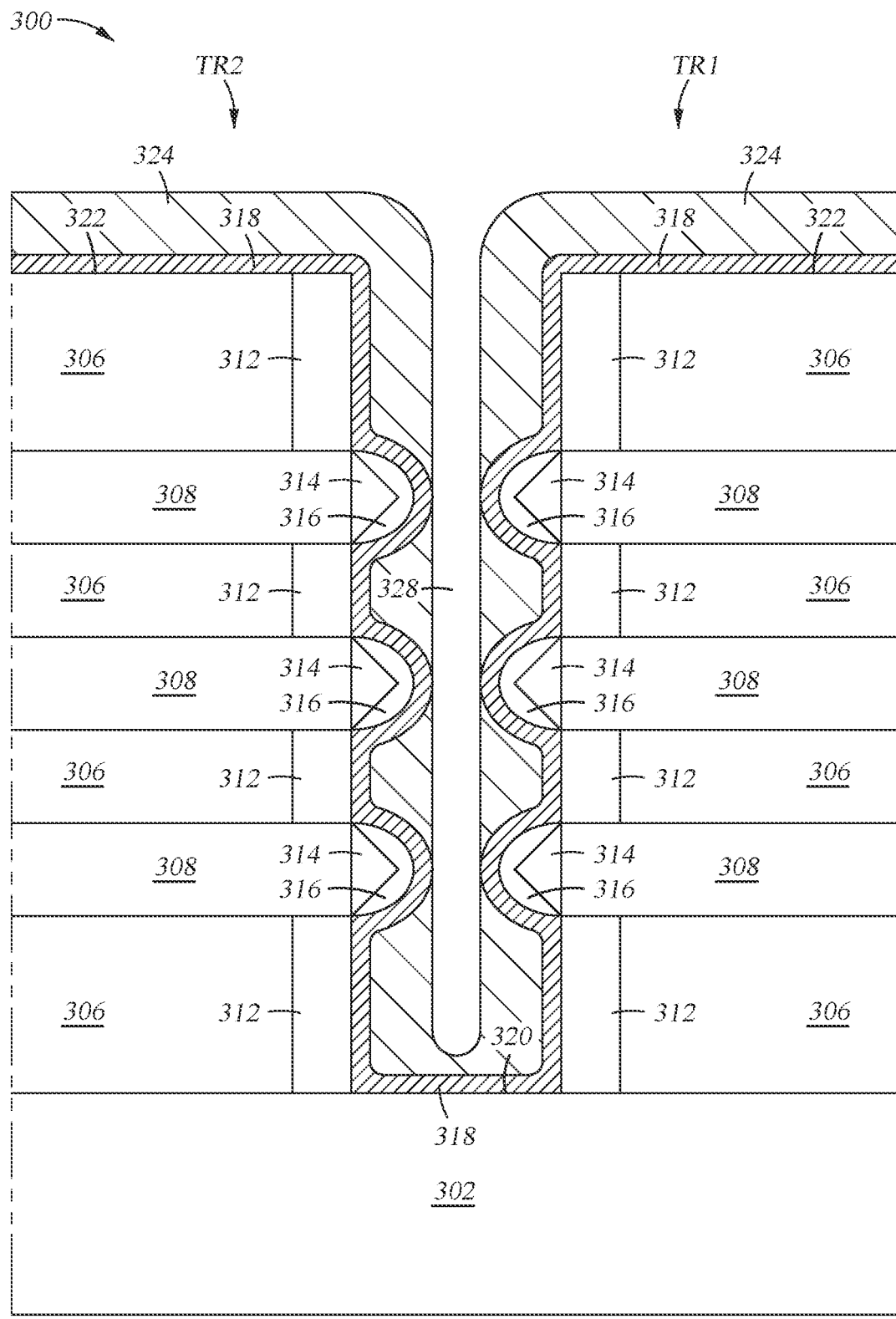

In block 250, an etch process is performed to selectively etch the contact plug 324 within the trench 304 and form an opening 328, as shown in FIG. 3G. The etch process in block 250 is performed using etching gas including an etchant gas and a carrier gas, in a processing chamber, such as the processing chamber 120, 122, 124, 126, 128, or 130 shown in FIG. 1. The etchant gas may include fluorine containing gas, such as nitrogen trifluoride ($NF_3$).

Figure 3H:
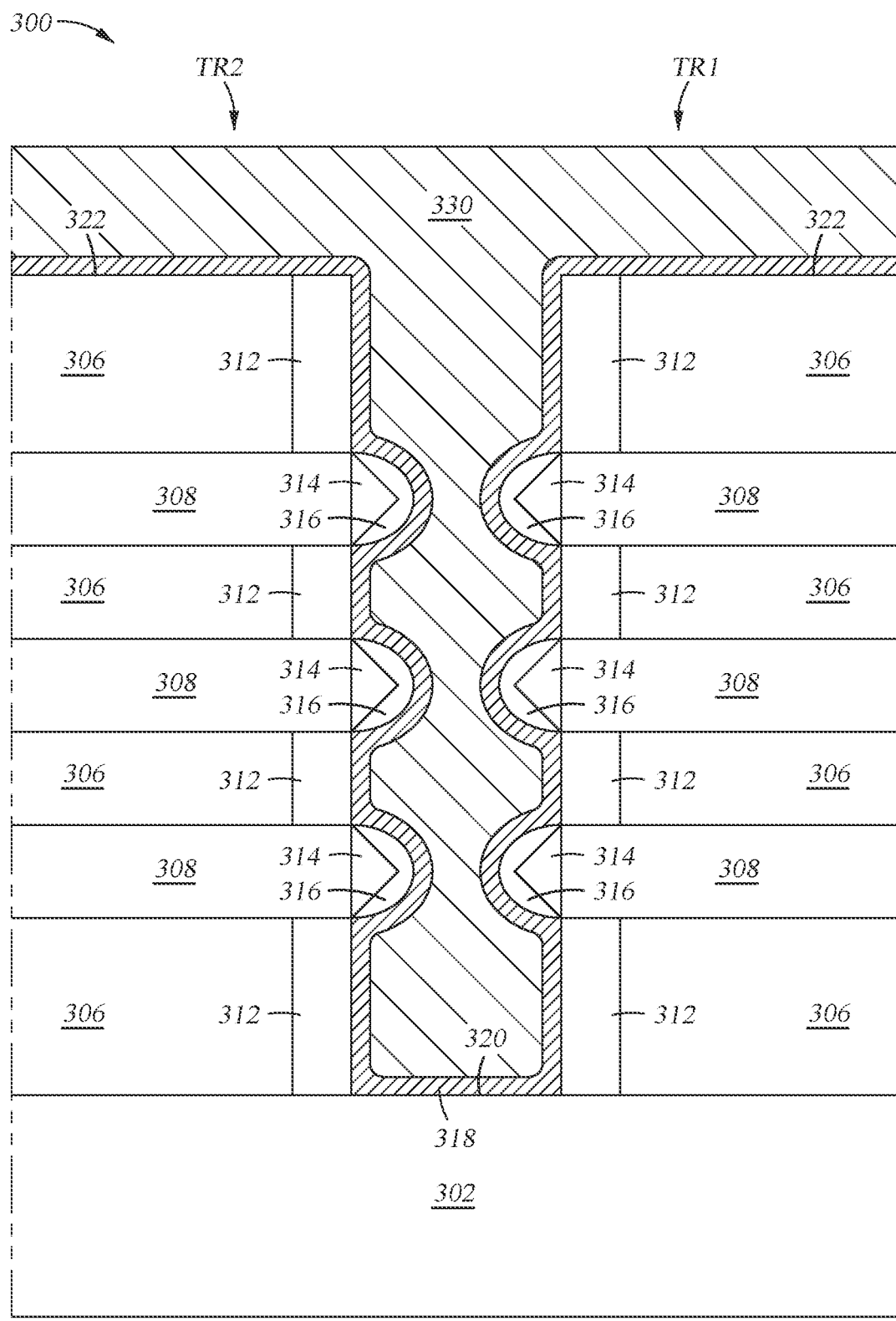

In block 260, a second metal process is performed to fill the opening 328 with the contact plug metal material to form a contact plug 330, as shown in FIG. 3H. The second metal fill process in block 260 is performed at the same conditions as the first metal fill process in block 240. The etch process in block 250 and the second metal fill process in block 260 may be repeated until the contact plug 330 is free of voids. Such void-free quality of the contact plug 330 may be observed by scanning electron microscope (SEM) or tunneling electron microscope (TEM) and may provide a reduced resistance of the contact 314. In some embodiments, the etch process in block 250 and the second metal fill process in block 260 are repeated for about 10 cycles.

The embodiments described herein provide systems and methods for forming a contact trench structure in transistor devices, such as gate-all-around (GAA) FET. The contact trench structure includes a metal contact plug formed within a trench between adjacent device modules, and contacts that interface between the contact plug and silicon-based channels in the device modules. The contacts are formed by a selective deposition process, reducing parasitic resistance. The metal contact plug is formed void-free by a deposition-each-deposition process, reducing contact resistance.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a contact trench structure in a semiconductor device, the method comprising:
    performing a first selective deposition process to form a contact on sidewalls of a trench, each of the sidewalls of the trench comprising a first cross section of a first material and a second cross section of a second material, the first selective deposition process comprising:
        epitaxially growing a third material on the sidewalls of the trench; and
        etching portions of the third material formed on the first cross section of the first material to form the contact selectively on the second cross section of the second material within the trench;
    performing a second selective deposition process to form a metal silicide layer on the contact, the second selective deposition process comprising:
        growing metal silicide material on the contact and the first cross section of the first material within the trench; and
        etching portions of the metal silicide material formed on the first cross section of the first material to form the metal silicide layer selectively on the contact;
    performing a first metal fill process to form a contact plug within the trench, the first metal fill process comprising depositing a contact plug metal material within the trench;
    performing an etch process to form an opening within the trench, comprising partially etching the contact plug metal material within the trench; and
    performing a second metal fill process, the second metal fill process comprising depositing the contact plug metal material within the opening.

2. The method of claim 1, wherein
the first material comprises silicon dioxide or silicon nitride, and
the second material comprises silicon-containing material.

3. The method of claim 1, wherein
the third material comprises material selected from a group consisting of silicon (Si), silicon carbide (SiC), and silicon germanium (SiG).

4. The method of claim 1, wherein
the contact plug metal material comprises material selected from a group consisting of tungsten (W), cobalt (Co), ruthenium (Ru), and molybdenum (Mo).

5. The method of claim 1, wherein
the metal silicide material comprises material selected from a group consisting of titanium (Ti) silicide, cobalt (Co) silicide, nickel (Ni) silicide, molybdenum (Mo) silicide, and tantalum (Ta) silicide.

6. The method of claim 1, further comprising:
performing a conformal deposition process prior to the first metal fill process, the conformal deposition process comprising:
    depositing a barrier metal material on exposed surfaces of the trench.

7. The method of claim 6, wherein
the barrier metal material comprises material selected from a group consisting of titanium nitride (TiN) and tantalum nitride (TaN).

8. A method of forming a void-free trench contact plug in a semiconductor device, the method comprising:
- performing a first selective deposition process to form a contact on sidewalls of a trench formed between pillars, each of the pillars comprising first semiconductor layers and second semiconductor layers that are alternately and repeatedly stacked, the first selective deposition process comprising:
  - epitaxially growing a third material on the sidewalls of the trench; and
  - etching portions of the third material formed on a first cross section of the first semiconductor layers to form the contact selectively on a second cross section of the second semiconductor layers within the trench;
- performing a second selective deposition process to form a metal silicide layer on the contact, wherein the second selective deposition process comprises:
  - growing metal silicide material on the contact and the first cross section of the first semiconductor layers within the trench; and
  - etching portions of the metal silicide material formed on the first cross section of the first semiconductor layers to form the metal silicide layer selectively on the contact;
- performing a first metal fill process to form a contact plug within the trench, the first metal fill process comprising depositing a contact plug metal material within the trench;
- performing an etch process to form an opening within the trench, comprising partially etching the contact plug metal material within the trench; and
- performing a second metal fill process, the second metal fill process comprising depositing the contact plug metal material within the opening.

9. The method of claim 8, wherein
the first semiconductor layers comprise silicon dioxide or silicon nitride, and
the second semiconductor layers comprise silicon-containing material.

10. The method of claim 8, wherein
the contact comprises material selected from a group consisting of silicon (Si), silicon carbide (SiC), and silicon germanium (SiGe).

11. The method of claim 8, wherein
the contact plug metal material comprises material selected from a group consisting of tungsten (W), cobalt (Co), ruthenium (Ru), and molybdenum (Mo).

12. The method of claim 8, further comprising:
conformally depositing a metal barrier layer on exposed surfaces of the trench.

13. The method of claim 12, wherein
the metal barrier layer comprises material selected from a group consisting of titanium nitride (TiN) and tantalum nitride (TaN).

* * * * *